United States Patent
Izumi et al.

(10) Patent No.: US 6,743,729 B2
(45) Date of Patent: Jun. 1, 2004

(54) ETCHING METHOD AND ETCHING APPARATUS OF CARBON THIN FILM

(75) Inventors: Katsutoshi Izumi, Sakai (JP); Keiji Mine, Yao (JP); Yoshiaki Ohbayashi, Nara (JP); Fumihiko Jobe, Yao (JP)

(73) Assignees: Osaka Prefecture, Osaka (JP); Hosiden Corporation, Yao (JP)

( * ) Notice: Subject to any disclaimer, the term of this patent is extended or adjusted under 35 U.S.C. 154(b) by 32 days.

(21) Appl. No.: 10/076,360

(22) Filed: Feb. 19, 2002

(65) Prior Publication Data

US 2002/0130107 A1 Sep. 19, 2002

(30) Foreign Application Priority Data

Mar. 19, 2001 (JP) ........................................ 2001-078402

(51) Int. Cl.[7] ...................... H01L 21/302; H01L 21/461
(52) U.S. Cl. ...................... 438/704; 438/689; 438/695; 438/706; 438/714; 438/715; 156/914; 204/192.35; 216/37
(58) Field of Search ........................ 438/704, 689–691, 438/705–6, 712–715, 695; 156/1, 345.1, 912–17; 204/192.35–192.37; 216/2, 37; 427/524, 534

(56) References Cited

U.S. PATENT DOCUMENTS

| | | | |
|---|---|---|---|
| 4,971,667 A | * | 11/1990 | Yamazaki et al. ..... 204/192.32 |
| 5,017,264 A | * | 5/1991 | Yamazaki et al. .......... 156/643 |
| 5,118,577 A | * | 6/1992 | Brar et al. .................. 428/409 |
| 5,707,487 A | * | 1/1998 | Hori et al. ............. 156/659.11 |
| 5,759,746 A | * | 6/1998 | Azuma et al. ............... 438/313 |
| 5,976,328 A | * | 11/1999 | Azuma et al. ......... 204/192.34 |
| 6,020,677 A | * | 2/2000 | Blanchet-Fincher et al. ..... 313/336 |
| 6,235,559 B1 | * | 5/2001 | Kuo ........................... 438/149 |
| 6,391,790 B1 | * | 5/2002 | Stoehr et al. ................ 438/715 |
| 6,407,367 B1 | * | 6/2002 | Ito et al. ..................... 219/390 |
| 6,468,916 B2 | * | 10/2002 | Choi et al. .................. 438/706 |
| 6,554,974 B2 | * | 4/2003 | Shiratori ................ 204/192.32 |
| 2002/0185058 A1 | * | 12/2002 | Izumi et al. .................. 117/97 |

FOREIGN PATENT DOCUMENTS

JP  2003-224248  * 8/2003  ........... H01L/27/12

* cited by examiner

*Primary Examiner*—Matthew Smith
*Assistant Examiner*—Granvill D. Lee
(74) *Attorney, Agent, or Firm*—Armstrong, Kratz, Quintos, Hanson & Brooks, LLP

(57) ABSTRACT

The present invention relates to etching for removing a carbon thin film formed on a surface of a sample, to prevent a damage on a sample and eliminate the necessity of providing a special device (such as vacuum pump) as is required in plasma etching. A sealed reaction chamber 100A in which a sample 500 formed with a carbon thin film 510 on its surface is to be set, a gas feed means 200A for feeding argon gas which is an inert gas Ar into which a predetermined proportion of oxygen gas $O_2$ has been mixed from one end to the interior of the reaction chamber 100A, an exhaust means 300A for discharging carbon dioxide gas $CO_2$ from the downstream side of the inert gas Ar fed from the gas feed means 200A, and a heating means 400A for heating the sample 500 to 550° C. or higher are provided.

6 Claims, 4 Drawing Sheets

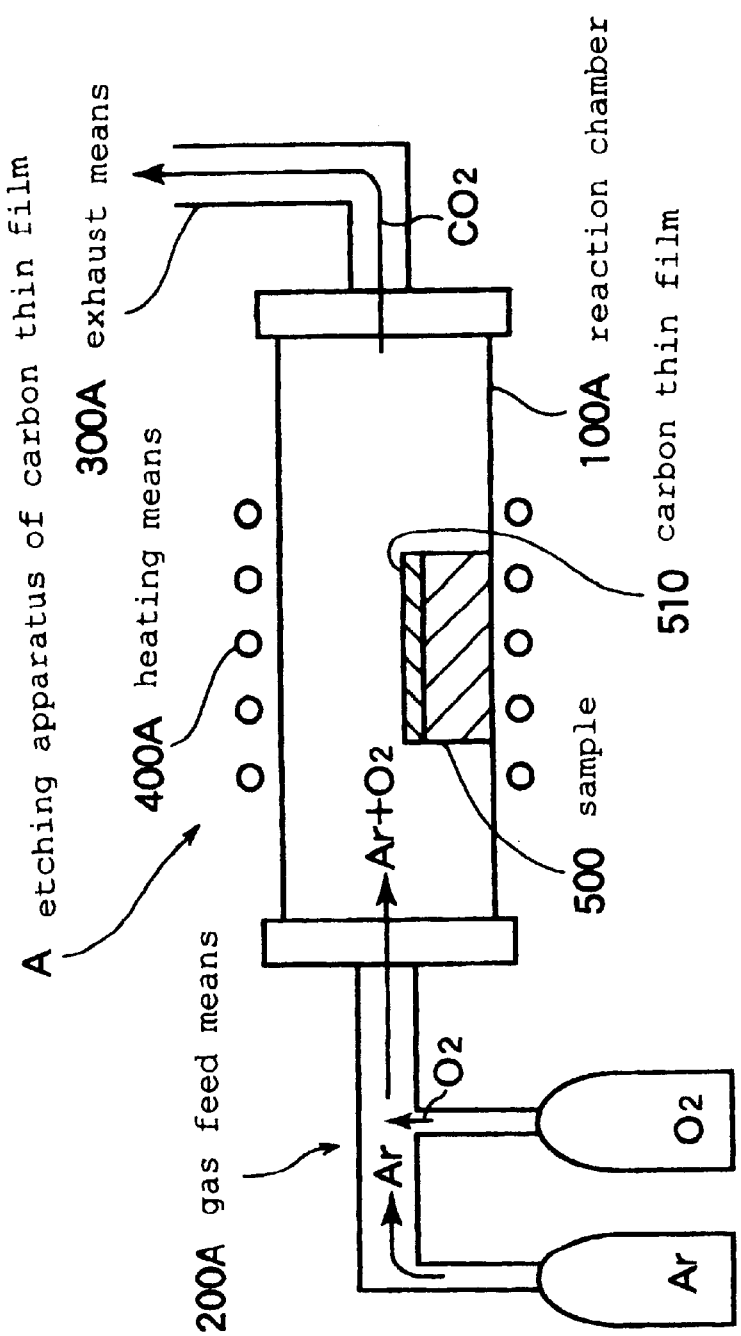
[Fig.1]

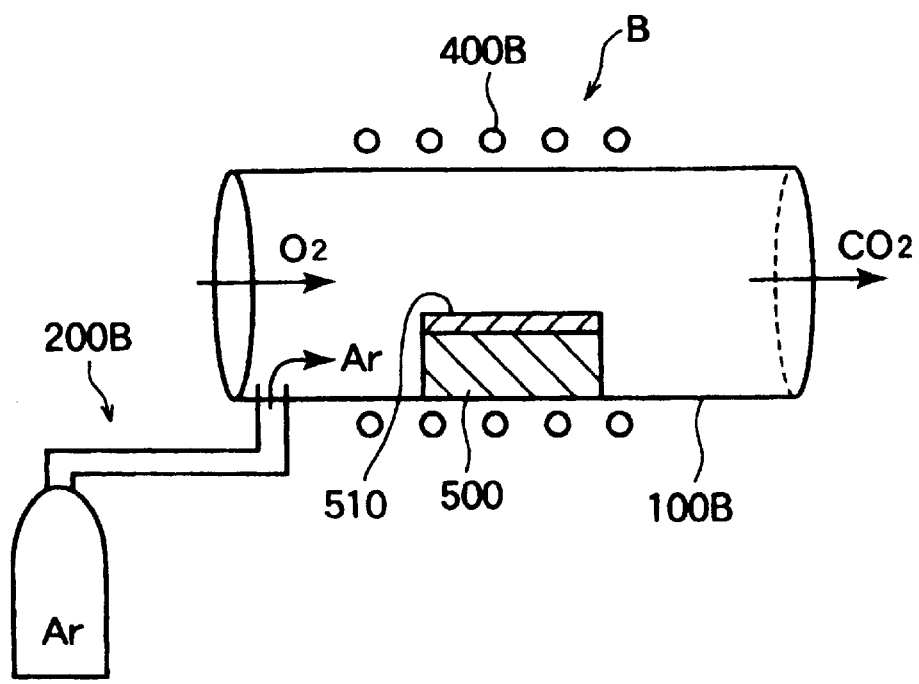
[Fig.2]

[Fig.3]
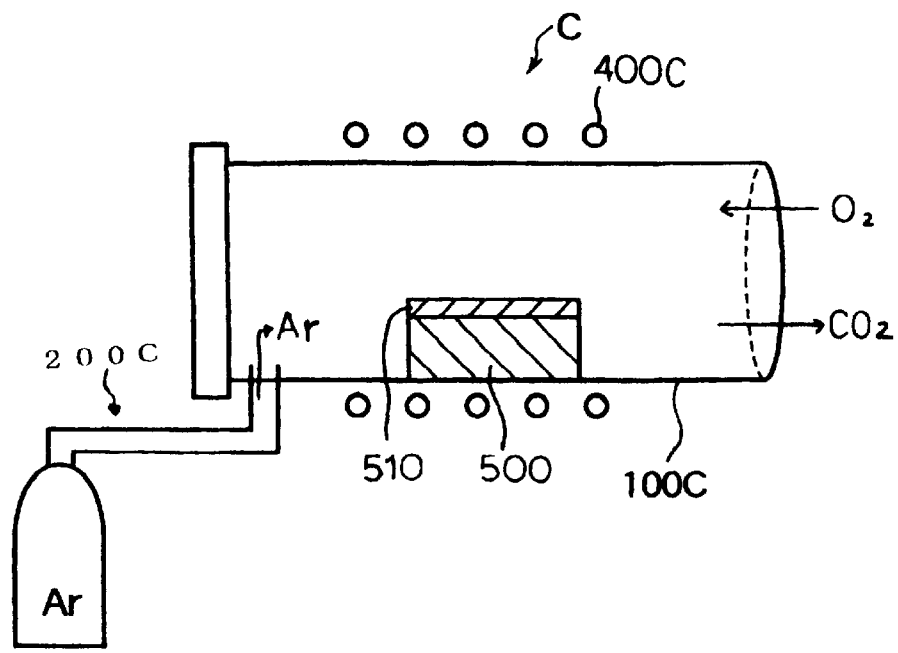

[Fig.4]
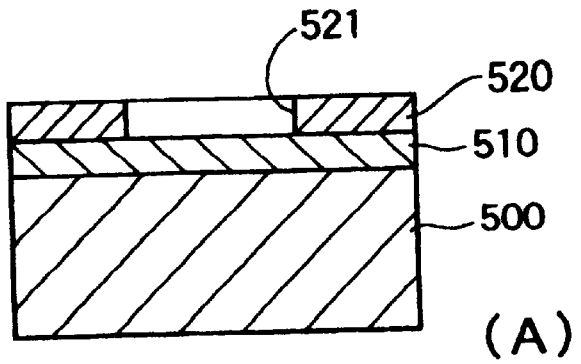
(A)
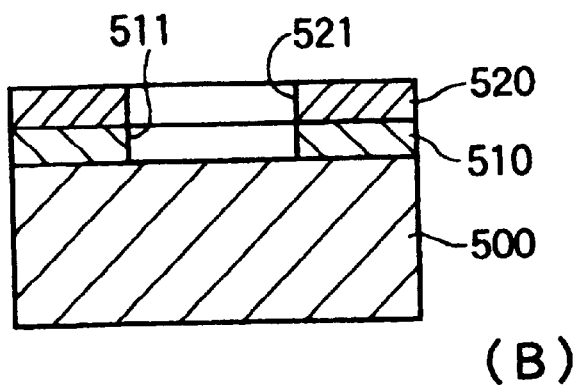
(B)
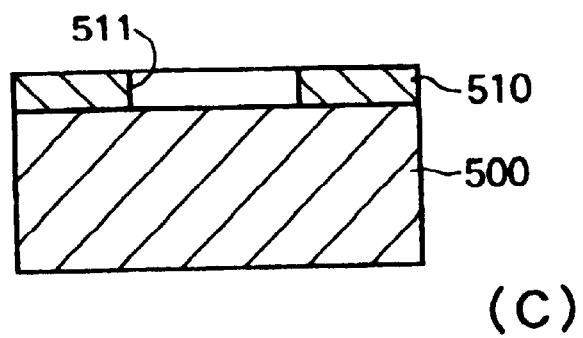
(C)

ETCHING METHOD AND ETCHING APPARATUS OF CARBON THIN FILM

BACKGROUND OF THE INVENTION

1. Field of the Invention

The present invention relates to an etching method and an etching apparatus of carbon thin film for etching a carbon thin film formed on a surface of a sample made of silicon, silicon carbide and the like.

2. Prior Art

For example, in the case where a carbon thin film is formed on a surface of a silicon substrate which is a sample, plasma etching is mainly used for removing the carbon thin film.

However, in such an etching of carbon thin film based on the plasma etching as described above, it was impossible to prevent the sample from getting damaged because energy particles come into collision with the surface of the sample. Damage in a sample used to be possible be recovered to some extent by annealing of post process, however, annealing for recovery of damage was sometimes not possible to be conducted in case that the etching step of carbon thin film is close to the final step in the process. This has been considered to be a serious problem in a manufacturing process of semiconductor devices.

In addition, since an etchant that chemically removes a carbon thin film has not existed yet, the above-described plasma etching which will cause some damage on the surface of a sample is in use.

The present invention was devised in consideration of the above circumstances, and it is an object of the present invention to provide an etching method and an etching apparatus of carbon thin film which, in etching to remove a carbon thin film formed on a surface of a sample, will not cause a damage on a surface of the sample, without requiring any special apparatus (such as vacuum pump) which has been required in plasma etching and the like.

SUMMARY OF THE INVENTION

An etching method of carbon thin film according to the present invention is an etching method of carbon thin film for removing a carbon thin film formed on a surface of a sample, and configured to etch the carbon thin film by heating the sample to 550° C. or higher in an atmosphere of an inert gas into which a predetermined proportion of oxygen gas has been mixed.

In addition, the etching apparatus of carbon thin film according to the present invention includes a sealed reaction chamber in which a sample formed with a carbon thin film on its surface is to be set, a gas feed means for feeding an inert gas into which a predetermined proportion of oxygen gas has been mixed from one end of the reaction chamber to the interior of the reaction chamber, an exhaust means for discharging carbon dioxide gas from the downstream side of the inert gas fed from the gas feed means, and a heating means for heating the sample to 550° C. or higher.

BRIEF DESCRIPTION OF THE DRAWINGS

FIG. 1 is a schematic configuration view of an etching apparatus of carbon thin film according to the first embodiment of the present invention.

FIG. 2 is a schematic configuration view of an etching apparatus of carbon thin film according to the second embodiment of the present invention.

FIG. 3 is a schematic configuration view of an etching apparatus of carbon thin film according to the third embodiment of the present invention.

FIG. 4 is a schematic cross-sectional view of one example of an etching method of carbon thin film according to the embodiment of the present invention.

Explanation of the Reference Numerals 100A reaction chamber
200A gas feed means
300A exhaust means
400A heating means
500 sample
510 carbon thin film
Ar inert gas
$O_2$ oxygen gas

Embodiments

FIG. 1 is a schematic configuration view of an etching apparatus of carbon thin film according to the first embodiment of the present invention; FIG. 2 is a schematic configuration view of an etching apparatus of carbon thin film according to the second embodiment of the present invention; FIG. 3 is a schematic configuration view of an etching apparatus of carbon thin film according to the third embodiment of the present invention; and FIG. 4 is a schematic cross-sectional view of one example of an etching method of carbon thin film according to the embodiment of the present invention.

An etching apparatus A of carbon thin film according to the first embodiment of the present invention includes a sealed reaction chamber 100A in which a sample 500 formed with a carbon thin film 510 on its surface is to be set, a gas feed means 200A for feeding argon gas which is an inert gas Ar into which a predetermined proportion of oxygen gas $O_2$ has been mixed from one end to the interior of the reaction chamber 100A, an exhaust means 300A for discharging carbon dioxide gas $CO_2$ from the downstream side of the inert gas Ar fed from the gas feed means 200A, and a heating means 400A for heating the sample 500 to 550° C. or higher.

The reaction chamber 100A is sealed up. However, the reaction chamber 100A is provided with a door (omitted in the drawing) which can be opened or closed for introducing/removing the sample 500. The heating means 400A such as heater is provided outside the reaction chamber 100A, making it possible to heat the set sample 500 to 550° C. or higher.

To one end side of the reaction chamber 100A is connected the gas feed means 200A for feeding argon gas which is the inert gas Ar and oxygen gas $O_2$ to be mixed into the argon gas. From this gas feed means 200A, argon gas and oxygen gas are fed at the rates of, for example, 1000 cc/min. and 100 cc/min., respectively.

In addition, to the other end side of reaction chamber 100A, i.e. the downstream side viewed from the gas feed means 200A side, is connected an exhaust pipe serving as the exhaust means 300A communicating with the external.

The sample 500 is to be set between the gas feed means 200A and the exhaust means 300A. Therefore, the inert gas Ar including oxygen gas $O_2$ fed from the gas feed means 200A necessarily passes around the sample 500.

The etching apparatus A of carbon thin film configured as described above etches the carbon thin film 510 formed on the sample 500 in following manner.

At first, the sample 500 is set inside the reaction chamber 100A. An internal pressure of the reaction chamber 100A in this case is adjusted to be equal to the atmospheric pressure.

Next, the inert gas Ar including oxygen gas $O_2$ is fed to the interior of the reaction chamber 100A from the gas feed means 200A. The feed amount of the argon gas which is the inert gas Ar is, for example, 1000 cc/min., while the feed amount of the oxygen gas $O_2$ is 100 cc/min.

And, while the inert gas Ar is fed, the sample 500 is heated to about 650° C. by the heating means 400A. This condition is kept for several minutes to several hours.

The carbon thin film 510 on the surface of the sample 500 changes to carbon dioxide gas $CO_2$ by the reaction of $C+O_2 \rightarrow CO_2$. This carbon dioxide $CO_2$ is discharged outside the reaction chamber 100A via the exhaust means 300A.

If the carbon thin film 510 on the surface of the sample 500 was completely removed by the etching, feed of the inert gas Ar by the gas feed means 200A is stopped, as well as heating of the sample 500 by the heating means 400A is stopped, and the sample 500 is taken out from reaction chamber 100A.

Next, an etching apparatus B of carbon thin film according to the second embodiment of the present invention will be explained while referring to FIG. 2.

The point in which the etching apparatus B of carbon thin film differs from the apparatus according to the first embodiment as described above is structures of a reaction chamber 100B and a gas feed means 200B and lack of the exhaust means.

In other words, the etching apparatus B of carbon thin film according to the second embodiment uses the reaction chamber 100B of a so-called both-end open type, in which both ends are open. Accordingly, the reaction chamber 100B is placed in the atmospheric air, and thus it is possible to use oxygen in the air for the oxygen gas $O_2$ to be mixed into the inert gas Ar. And the inert gas Ar is fed from the gas feed means 200B to the interior of the reaction chamber 100B. Oxygen gas $O_2$ in air is mixed with the inert gas Ar by a flow of the inert gas Ar that has been fed from gas feed means 200B, and then flows around the sample 500.

Furthermore, since both ends of the reaction chamber 100B are open, carbon dioxide $CO_2$ generated as a result of a chemical reaction with the carbon thin film 510 is discharged outside from the open ends of the reaction chamber 100B by a flow of the inert gas Ar. Therefore, in this etching apparatus B of carbon thin film, exhaust is naturally achieved from the open ends of the reaction chamber 100B without necessity of providing the exhaust means 300A according to the first embodiment.

Also in this etching apparatus B of carbon thin film, the carbon thin film 510 of the sample 500 changes to carbon dioxide gas $CO_2$ by a chemical change, and the action of being removed from the surface of the sample 500 is as same as that described above. Furthermore, the reference numeral 400B in the drawing represents a heating means for heating the sample 500 to 550° C. or higher.

Next, an etching apparatus C of carbon thin film according to the third embodiment of the present invention will be explained while referring to FIG. 3.

The point in which the etching apparatus C of carbon thin film according to the third embodiment differs from that according to the first embodiment as described above is structures of a reaction chamber 100C and a gas feed means 200C and lack of the exhaust means.

The reaction chamber 100C in this etching apparatus C of carbon thin film is a so-called either-end-open type in which only one end side is open and the other end side is closed. The gas feed means 200C feeds inert gas Ar of argon gas or the like from the closed side of the reaction chamber 100C. And, since the reaction chamber 100C is placed in the atmospheric air, it is possible to use oxygen in the air for the oxygen gas $O_2$ to be mixed into the inert gas Ar. Oxygen gas $O_2$ in the air is mixed with the inert gas Ar by a flow of the inert gas Ar fed from the gas feed means 200C to flow around the sample 500. Furthermore, since one end of the reaction chamber 100C is open, carbon dioxide $CO_2$ generated as a result of a chemical reaction with the carbon thin film 510 is discharged outside from the one end of the reaction chamber 100C by a flow of the inert gas Ar. Therefore, in the etching apparatus C of carbon thin film, exhaust is naturally achieved from the open end of the reaction chamber 100C without necessity of providing the exhaust means 300A according to the first embodiment.

Also in this etching apparatus C of carbon thin film, the carbon thin film 510 of the sample 500 changes to carbon dioxide gas $CO_2$ by a chemical change, and the action of being removed from the surface of the sample 500 is as same as that described above. Furthermore, the reference numeral 400C in the drawing represents a heating means for heating the sample 500 to 550° C. or higher.

While the sample 500 is heated to about 650° C. in the above described etching apparatuses A, B and C of carbon thin film according to the first to third embodiments, it is experimentally confirmed that the carbon thin film 510 can be removed by etching when the sample 500 is heated to a temperature in the range of 550° C. to 1270° C., namely, at least 550° C. or higher. It is confirmed that heating to the sample 500 to 690° C. is particularly preferred in terms of the efficiency.

In addition, it is to be noted that the above described feed amounts of the inert gas Ar and the oxygen gas $O_2$ are only examples and the present invention is not limited thereto.

In this above described embodiments, explanation was made for the case where the carbon thin film 510 formed on the surface of the sample 500 is wholly removed, however, as shown in FIG. 4, when a mask 520 made of, for example, silicon, silicon oxide, silicon nitride or the like is formed on the carbon thin film 510 (see FIG. 4(A)), only the carbon thin film 510 that exposes at an opening 521 of the mask 520 can be removed (see FIG. 4(A)) As a result of this, a carbon thin film 510 of desired pattern having an opening 511 corresponding to the shape and size of the opening 521 can be formed on the surface of the sample 500 by removing the mask 520 afterwards (see FIG. 4(C)).

In addition, while argon gas was exemplified as a representative of the inert gas Ar, it goes without saying that other inert gas can be used, with the argon gas being most excellent in economical point.

Effect of the Invention

An etching method of carbon thin film according to the present invention is an etching method of carbon thin film for removing a carbon thin film formed on a surface of a sample, wherein the carbon thin film is etched by heating the sample to 550° C. or higher in an atmosphere of inert gas into which a predetermined proportion of oxygen gas has been mixed.

Therefore, according to the present etching method of carbon thin film, a carbon thin film formed on a sample can be easily removed by etching at relatively low temperatures, so that a damage will not be caused on the sample in contrast to the case of plasma etching. In addition, also a complicated apparatus as is needed in the case of plasma etching is not required. For example, the present invention is also applicable to removal of withered photo resists in semiconductor manufacturing process.

In addition, by arranging to etch the carbon thin film while forming a mask on the carbon thin film, it is possible to etch the carbon thin film in accordance with the shape and size of opening of the mask.

Also, an etching apparatus of carbon thin film according to the present invention comprises a sealed reaction chamber in which a sample formed with a carbon thin film on its surface is to be set, a gas feed means for feeding an inert gas into which a predetermined proportion of oxygen has been mixed from one side to the interior of the reaction chamber, an exhaust means for discharging carbon dioxide gas from the downstream side of the inert gas fed from the gas feed means, and a heating means for heating the sample to 550° C. or higher.

According to the present etching apparatus of carbon thin film, it becomes possible to remove the carbon thin film by etching without causing any damage on the sample. And, the configuration of the apparatus is simple in comparison with apparatuses conventionally used for plasma etching. Therefore, the present apparatus can also be used in semiconductor manufacturing processes for mass production.

Further, another etching apparatus of carbon thin film according to the present invention comprises a sealed reaction chamber of both-end open type in which a sample formed with a carbon thin film on its surface is to be set, a gas feed means for feeding an inert gas inside the reaction chamber via one of the open ends, and a heating means for heating the sample to 550° C. or higher, wherein the reaction chamber is placed in the atmospheric air.

Therefore, an effect is achieved that the total configuration is simple in comparison with the above-described etching apparatus of carbon thin film in which oxygen gas is mixed into the inert gas.

Furthermore, yet another etching apparatus of carbon thin film according to the present invention comprises a sealed reaction chamber of either-end-open type in which a sample formed with a carbon thin film on its surface is to be set, a gas feed means for feeding an inert gas inside the reaction chamber via a close end thereof, and a heating means for heating the sample to 550° C. or higher, wherein the reaction chamber is placed in the atmospheric air.

Therefore, in addition to the effect that the total configuration is simple in comparison with the above described etching apparatus of carbon thin film in which oxygen gas is mixed into the inert gas, an effect that carbon oxide gas generated as a result of removing the carbon thin film by etching will not flow backward.

FIG. 1
1 gas feed means
2 etching apparatus of carbon thin film
3 heating means
4 exhaust means
5 reaction chamber
6 carbon thin film
7 sample

What is claimed is:

1. An etching method of carbon thin film for removing a carbon thin film formed on a surface of a sample, wherein said carbon thin film is etched by heating said sample to 550° C. or higher in an atmosphere of inert gas into which a predetermined proportion of oxygen gas has been mixed.

2. The Etching method of carbon thin film according to claim 1, wherein the carbon thin film is etched while a mask is formed on said carbon thin film.

3. The etching method of carbon thin film according to claim 2, wherein either silicon, silicon oxide or silicon nitride is used as a material of said mask.

4. An etching apparatus of carbon thin film comprising:
a sealed reaction chamber in which a sample formed with a carbon thin film on its surface is to be set, a gas feed means for feeding an inert gas into which a predetermined proportion of oxygen gas has been mixed, from one side to the interior of the reaction chamber, an exhaust means for discharging carbon dioxide gas from the downstream side of said inert gas fed from the gas feed means, and a heating means for heating said sample to 550° C. or higher.

5. An etching apparatus of carbon thin film comprising:
a sealed reaction chamber of both-end-open type in which a sample formed with a carbon thin film on its surface is to be set, a gas feed means for feeding an inert gas to the interior of the reaction chamber from one of the open ends, and a heating means for heating said sample to 550° C. or higher, wherein said reaction chamber is placed in the atmospheric air.

6. An etching apparatus of carbon thin film comprising:
a sealed reaction chamber of either-end-open type in which a sample formed with a carbon thin film on its surface is to be set, a gas feed means for feeding an inert gas to the interior of the reaction chamber from a close end thereof, and a heating means for heating said sample to 550° C. or higher, wherein said reaction chamber is placed in the atmospheric air.

* * * * *